(12) United States Patent
Ishikawa et al.

(10) Patent No.: US 8,525,394 B2
(45) Date of Patent: Sep. 3, 2013

(54) MESA-TYPE AT-CUT QUARTZ-CRYSTAL VIBRATING PIECE AND QUARTZ-CRYSTAL DEVICE

(75) Inventors: Manabu Ishikawa, Sayama (JP); Kenji Shimao, Sayama (JP); Hiroyuki Sasaki, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 174 days.

(21) Appl. No.: 13/223,463

(22) Filed: Sep. 1, 2011

(65) Prior Publication Data

US 2012/0056514 A1    Mar. 8, 2012

(30) Foreign Application Priority Data

Sep. 2, 2010  (JP) ................................. 2010-196303
Sep. 10, 2010  (JP) ................................. 2010-202543
Sep. 30, 2010  (JP) ................................. 2010-220310

(51) Int. Cl.
*H01L 41/09* (2006.01)

(52) U.S. Cl.
USPC ........................................................ 310/361

(58) Field of Classification Search
USPC ................. 310/320, 324, 361, 344, 348, 368, 310/367, 365, 346, 360

IPC ........................................................ H04I 41/09
See application file for complete search history.

(56) References Cited

U.S. PATENT DOCUMENTS 7,608,987 B2 * 10/2009 Naito et al. ................... 310/361
8,084,926 B2 * 12/2011 Naito et al. ................... 310/361
2008/0036335 A1 *  2/2008 Naito et al. ................... 310/361

FOREIGN PATENT DOCUMENTS

JP    2002018698 A    1/2002

* cited by examiner

*Primary Examiner* — Thomas Dougherty
*Assistant Examiner* — Karen B Addison
(74) *Attorney, Agent, or Firm* — Alix, Yale & Ristas, LLP

(57) ABSTRACT

To provide an AT-cut quartz-crystal vibrating piece in which size of the vibrating unit is adjusted to appropriate value, so that the unnecessary vibration is inhibited and degradation of its characteristics is prevented. A mesa-type AT-cut quartz-crystal vibrating piece for vibrating at 38.400 MHz comprising a rectangular excitation unit (31) and a peripheral region (32) formed on the periphery of the excitation unit and having a thickness less than the thickness of the excitation unit, is represented by the following equation: $Mx/Gx=0.09 \times n - 0.06$ (n: natural number) . . . (1). Length of a crystallographic x-axis direction of the excitation unit is defined as Mx (mm) and length of the crystallographic x-axis direction of the peripheral region and excitation unit is defined as Gx (mm).

18 Claims, 8 Drawing Sheets

100

100

100

30

30

MESA-TYPE AT-CUT QUARTZ-CRYSTAL VIBRATING PIECE AND QUARTZ-CRYSTAL DEVICE

CROSS-REFERENCE TO RELATED APPLICATION

This application claims priority to and the benefit of Japan Patent Application No. 2010-196303, filed on Sep. 2, 2010, Japan Patent Application No. 2010-202543, filed on Sep. 10, 2010, and Japan Patent Application No. 2010-220310, filed on Sep. 30, 2010, in the Japan Patent Office, the disclosures of which are incorporated herein by reference in their entirety.

FIELD

The present disclosure pertains to the mesa-type AT-cut quartz-crystal vibrating piece and the quartz-crystal device comprising the same.

DESCRIPTION OF THE RELATED ART

One of the representative thickness-shear mode vibrating pieces is an AT-cut quartz-crystal vibrating piece. The quartz-crystal devices accommodating such AT-cut quartz-crystal device within their respective package are commonly used in different types of electric devices as standard frequency sources. These quartz-crystal devices are being reduced in size, and recently developed AT-cut quartz-crystal vibrating pieces may include a curved, beveled or convex region at the outer periphery of the principal surface, in order to efficiently acquire energy trapping behavior.

Curve processing, such as bevel or convex processing as disclosed in Japan Unexamined Patent Application No. 2002-018698, forms the sloped region on outer periphery of the quartz-crystal vibrating piece by a barrel polishing method. However, the AT-cut manufacturing method by wafer method has advanced in recent years, which made contouring more difficult. Therefore, mesa-type, flat central area being thicker than that of peripheral area, processing is applied to the AT-cut quartz-crystal vibrating piece, in place of the contouring method.

However, in the mesa-type AT-cut quartz-crystal vibrating piece, the vibrating energy of the principal energy generated from the vibrating unit is mixed with unnecessary vibrating energy generated at the outer periphery of the vibrating unit, thus causing degradation of the AT-cut quartz-crystal vibrating piece.

It is therefore the purpose of the present disclosure to provide a mesa-type AT-cut quartz-crystal vibrating piece, in which the dimensions of the vibrating unit and the peripheral region of the vibrating unit are adjusted to appropriate values, so that the unnecessary vibrational energy is inhibited, degradation of its characteristics is prevented and the rejection rate is decreased.

SUMMARY

In its first aspect, an AT-cut mesa-type quartz-crystal vibrating piece is provided. A mesa-type AT-cut quartz-crystal vibrating piece for vibrating at 38.400 MHz comprising a rectangular excitation unit and a peripheral region formed on the periphery of the excitation unit having a thickness less than the excitation unit, is represented by the following equation:

$$Mx/Gx = 0.09 \times n - 0.06 \ (n: \text{natural number}) \quad (1)$$

Length of a crystallographic x-axis direction of the excitation unit is defined as Mx (mm) and length of the crystallographic x-axis direction of the peripheral excitation unit is defined as Gx (mm).

In its second aspect, an AT-cut mesa-type quartz-crystal vibrating piece is provided. The mesa-type AT-cut quartz-crystal vibrating piece for vibrating at 38.400 MHz, comprising a rectangular excitation unit and a peripheral region formed on the periphery of the excitation unit having a thickness less than the excitation unit, is represented by the following ratio:

$$(Tm-Ts)/Tm;$$

wherein the thickness of the vibrating unit is defined as Tm (μm) and the thickness of the peripheral region is defined as Ts (μm); and
wherein the ratio $(Tm-Ts)/Tm$ comprises a value larger than 0.048 and smaller than 0.2.

In its third aspect, an AT-cut mesa-type quartz-crystal vibrating piece is provided. The mesa-type AT-cut quartz-crystal vibrating piece comprises: a rectangular excitation unit and a peripheral region formed on the periphery of the excitation unit having a thickness less than the excitation unit; wherein a thickness of the excitation unit is denoted as Tm, and a length of the crystallographic x-axis of the excitation unit is denoted as Mx, a minimum value of the crystal impedance is acquired within the range of Mx/Tm being larger than 15.7 and smaller than 18.0; and wherein a size of the excitation unit at the minimum value is implemented in relation to the Mx/Tm ratio.

In its fourth aspect, an AT-cut mesa-type quartz-crystal vibrating piece is provided. In its fourth aspect, the vibration frequency of the mesa-type AT-cut quartz-crystal vibrating piece of the third aspect is 38.400 MHz and the Mx/Tm ratio is larger than 17.3 and smaller than 17.7.

In its fifth aspect, an AT-cut mesa-type quartz-crystal vibrating piece is provided. In its fifth aspect, the vibration frequency of the mesa-type AT-cut quartz-crystal vibrating piece of the fifth aspect is 32.736 MHz and the Mx/Tm ratio is larger than 16.1 and smaller than 16.6, or is larger than 16.7 and smaller than 16.9.

In its sixth aspect, an AT-cut mesa-type quartz-crystal vibrating piece is provided. In its sixth aspect, the vibration frequency of the mesa-type AT-cut quartz-crystal vibrating piece of the sixth aspect is 26.000 MHz and the Mx/Tm ratio is larger than 15.7 and smaller than 16.4, or is larger than 17.3 and smaller than 18.0.

In its seventh aspect, an AT-cut mesa-type quartz-crystal vibrating piece is provided. The mesa-type AT-cut quartz-crystal vibrating piece of any one of the first to sixth aspect comprises an outer frame for surrounding the peripheral region of the excitation unit and supporting the peripheral region thereof.

In its eighth aspect, a quartz-crystal device is provided. The quartz-crystal device of any one of the first to sixth aspect comprises: a mesa-type AT-cut quartz-crystal vibrating piece of the first aspect; a base having a recess for containing the mesa-type AT-cut quartz-crystal vibrating piece; and a lid for hermetically sealing the recess.

In its ninth aspect, a quartz-crystal device is provided. The quartz-crystal device of seventh aspect comprises: the mesa-type AT-cut quartz-crystal vibrating piece of the second aspect having a first principal surface and a second principal surface; a lid having a first surface to be bonded onto the first principal surface of the outer frame; and a base having a second surface to be bonded onto the second principal surface of the outer frame.

The present disclosure provides a mesa-type AT-cut quartz-crystal vibrating piece, in which size of the vibrating unit and the peripheral vibrating unit is adjusted to appropriate value, so that the unnecessary vibration is inhibited, degradation of its characteristics is prevented and the rejection rate is decreased.

DETAILED DESCRIPTION

Various representative embodiments are described below with reference to the respective drawings. It will be understood that the scope of the disclosure is not limited to the described embodiments, unless otherwise stated.

First Embodiment

Configuration of the Quartz-Crystal Device 100

Figure 1A:
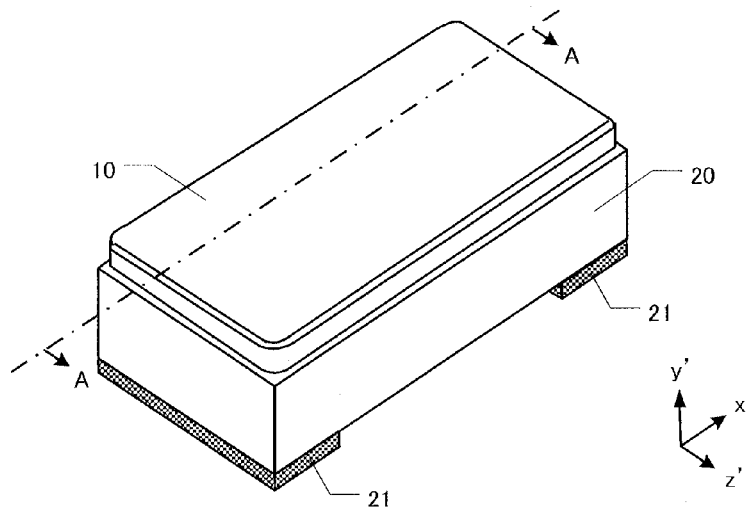
FIG. 1A is a perspective view of the quartz-crystal device 100.

FIG. 1A is a perspective view of the quartz-crystal device 100. The quartz-crystal device 100 is constituted of the lid 10, base 20 and AT-cut quartz-crystal vibrating piece 30 mounted onto the base 20 (refer to FIG. 1B). The AT-cut quartz-crystal vibrating piece has a principal surface that is inclined, with respect to the Y-axis of the crystal axes (XYZ), from the Z-axis to the Y-axis direction by 35° 15', with the X-axis as a center. Therefore, the quartz-crystal device 100 is described below by designating a longitudinal direction thereof as the x-axis direction, designating the short-side direction as the z'-axis direction, and thickness direction thereof as the y-axis direction. In this explanation below, inclination to the y'-axis is denoted as +y'-axis and declination to the y'-axis is denoted as −y'-axis.

A cavity 24 is formed on the inner side of the base 20 (refer to FIG. 1B), and an AT-cut quartz-crystal vibrating piece 30 is situated onto the cavity 24. The external electrodes 21 are formed on the bottom surface of the base 20. The lid 10 is disposed on the +y'-axis side from the base 20, so as to hermetically seal the cavity 24. The lid 10 is fabricated from materials such as ceramic, glass, quartz-crystal and metal. The base 20 is also fabricated from materials such as ceramic, glass and quartz-crystal.

Figure 1B:
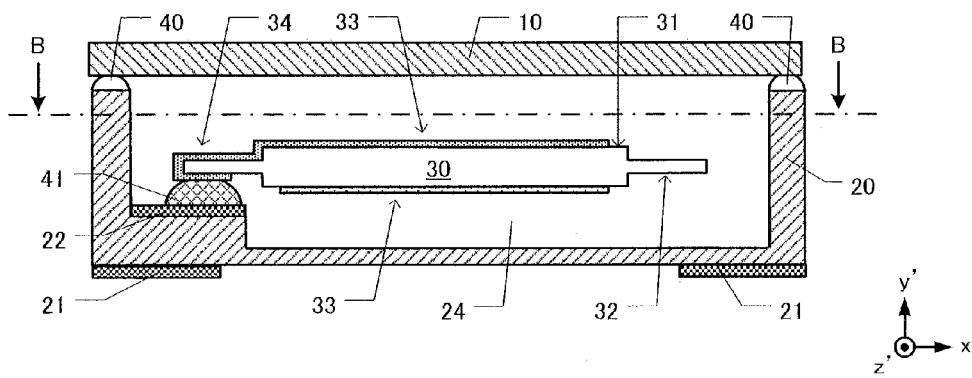
FIG. 1B is a cross-sectional view of the quartz-crystal device 100.

FIG. 1B is a cross-section of the quartz-crystal device 100. FIG. 1B is a cross-section of the FIG. 1A taken along A-A line or the FIG. 1C along C-C line, which will be explained hereafter. The cavity 24 is provided by forming a recess on the base 20. The connecting electrodes 22 are formed on lower side of the cavity 24, and the connecting electrodes 22 are electrically connected to the external electrodes 21 through a conductor (not shown). On the AT-cut quartz-crystal vibrating piece 30, excitation unit 31 and its peripheral region 32, disposed on the outer periphery of the excitation unit 31, are formed. The peripheral region 32 of the excitation unit 31 has a thickness less than the thickness of the excitation unit 31. The excitation electrodes 33 are formed on both the upper principal surface and lower principal surface of the excitation unit 31. The extraction electrodes 34 are formed on the peripheral region 32 of the excitation unit 31, and the extraction electrodes 34 are electrically connected to the excitation electrodes 33. The excitation electrodes 33 and the extraction electrodes 34 comprises a chrome (Cr) layer on surfaces of the quartz-crystal and a gold (Au) layer overlays the surface of the chrome (Cr) layer. The extraction electrodes 34 are electrically connected to respective connecting electrodes 22 using an electrically conductive adhesive 41. Thereby, the excitation electrodes 33 are electrically connected to respective external electrodes 21.

Figure 1C:
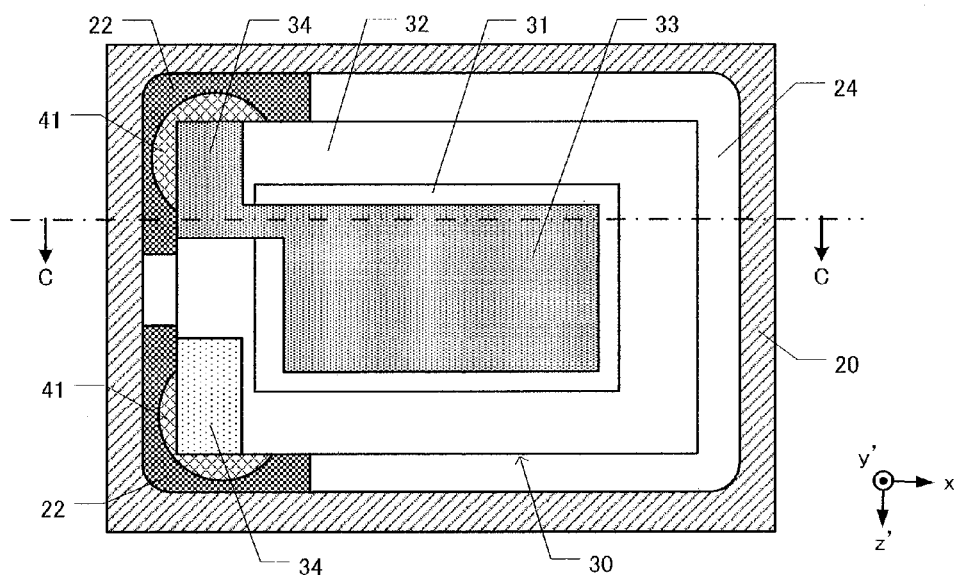
FIG. 1C is a cross-sectional view of the quartz-crystal device 100 taken along B-B line.

FIG. 1C is a cross-section of the FIG. 1B along B-B line. Two connecting electrodes 22 are formed on the cavity 24 situated on the base 20. One connecting electrode 22 is electrically connected to the excitation electrode 33 situated on the upper surface of the excitation unit 31 on the AT-cut quartz-crystal vibrating piece 30, and the other connecting electrode 22 is electrically connected to the excitation electrode 33 situated on lower surface of the excitation unit 31.

Figure 2A:
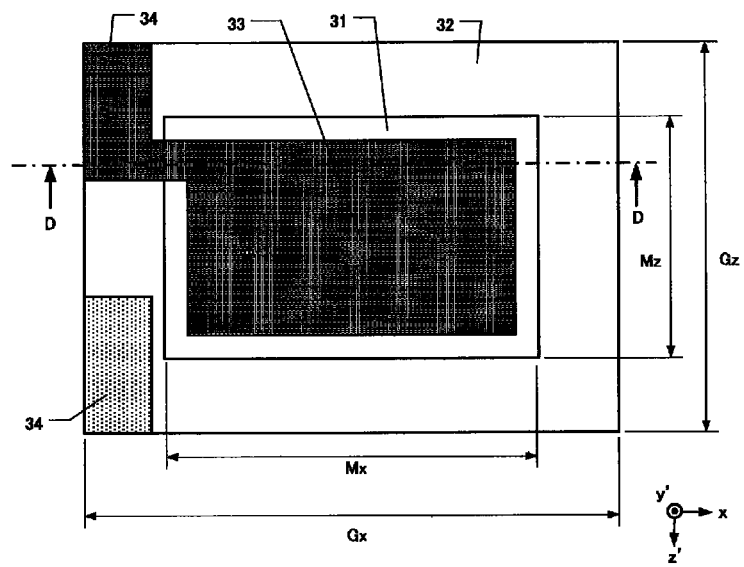
FIG. 2A is a plan view of the AT-cut quartz-crystal vibrating piece 30.

FIG. 2A is a plan view of the AT-cut quartz-crystal vibrating piece 30. The AT-cut quartz-crystal vibrating piece 30 has the same respective x-axis direction as the crystallographic X-axis of the quartz-crystal. Also, the z'-axis direction of the AT-cut quartz-crystal vibrating piece 30 has the same respective axial direction as the direction of the quartz-crystal from the Z-axis to the Y-axis direction tilted by 35° 15' with the X-axis direction as a center. Length Gx of the excitation unit 31 including the peripheral region 32 in the x-axis direction is, for example, 1.35 mm, and width Gz of the peripheral excitation unit in the z'-axis direction is, for example, 0.85 mm. Also, the length of the excitation unit 31 in the x-axis direction is denoted as Mx and the width of the excitation unit 31 in the z'-axis direction is denoted as Mz.

Figure 2B:
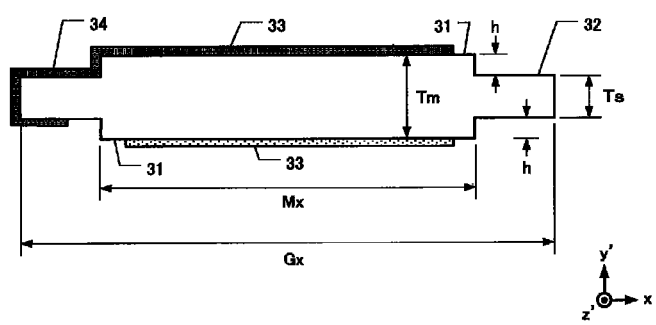
FIG. 2B is a cross-sectional view of FIG. 2A taken along D-D line.

FIG. 2B is a cross-section of FIG. 2A, taken along D-D line. Thickness of the peripheral region 32 of the excitation unit 31 of the AT-cut quartz-crystal vibrating piece 30 is denoted as Ts, and the thickness of the excitation unit 31 is denoted as Tm. The thickness difference between the excitation unit 31 and peripheral region 32 are formed on both +y'-axis side surface and −y'-axis side surface of the AT-cut quartz-crystal vibrating piece 30, and both thickness differences have same height. Also, when the half of thickness difference between the excitation unit 31 and the peripheral region 32 is denoted as height h, height h indicating height of the half of thickness difference is positive, and the thickness Tm of the excitation unit 31 is thicker than the thickness Ts of the peripheral region 32.

<Relationship Between Mx/Gx and CI (Crystal Impedance) Value>

An experiment was performed to determine the best-mode dimensions of the AT-cut quartz-crystal vibrating piece 30. The experiment varied the ratio Mx/Gx, wherein Mx is the length of the excitation unit 31 in the x-axis direction and Gx is the length of the excitation unit 31 and peripheral region 32 in the x-axis direction to determine the best dimensions to obtain a low CI (crystal impedance) value for suppressing unnecessary vibration. The relationship is explained hereinafter.

Figure 3:
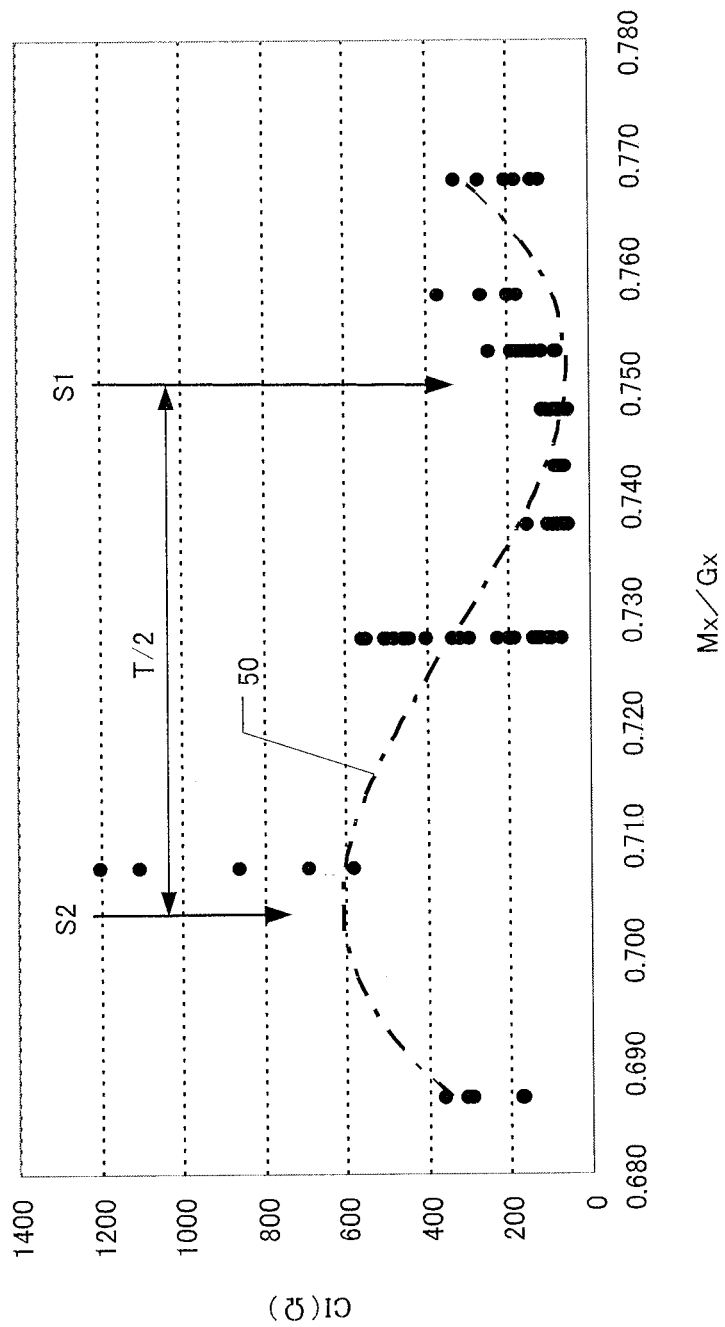
FIG. 3 is a graph describing the correlation between the Mx/Gx and CI value at the vibration frequency of 38.400 MHz.

FIG. 3 is a graph describing the correlation between the Mx/Gx and CI (crystal impedance) value at the vibration frequency of 38.400 MHz. In FIG. 3, the abscissa indicates the ratio Mx/Gx, wherein Mx represents length of the excitation unit 31 in x-axis direction and Gx represents length of the peripheral region 32 and excitation unit 31 in x-axis direction, and the ordinate indicates the CI value (Ω). In the experiment, a plurality of the AT-cut quartz-crystal vibrating pieces 30 are manufactured, in which the length Gx of the outline of the AT-cut quartz-crystal vibrating piece 30 in x-axis direction is a fixed value, and the length Mx of the excitation unit 31 in x-axis direction is altered. The measurement results of the CI values of such AT-cut quartz-crystal vibrating pieces 30 are indicated in FIG. 3.

Each black circle indicated in FIG. 3 indicates one measuring point of the CI value of the quartz-crystal vibrating piece 30. After fitting measuring points indicated in black circles by using expressions in the third order, the experiment produced the curve indicated in FIG. 3 with one dotted-dash line 50.

In FIG. 3, one dotted-dash line 50 comprises both the minimum value and the maximum value. The minimum value and maximum value of the CI value is considered to be affected by flexural vibration, which is an unnecessary vibration mode. Also, the flexural vibration is considered to have a periodical nature against the Mx/Gx. Therefore, the minimum value and maximum value of the CI value is considered to have a periodical nature against the Mx/Gx. FIG. 3 shows that the CI value is at the minimum value whenever the Mx/Gx is 0.75 (indicated with arrow S1 in FIG. 3), and CI value is at the maximum value whenever the Mx/Gx is 0.705. The interval between the arrow S1 and arrow S2 is 0.045, and the value 0.045 is a half cycle T/2 of one dotted-dash line 50. The cycle T of one dotted-dash line 50 is: 0.045×2=0.09. Therefore, the Mx/Gx having the minimum value of CI value includes the Mx/Gx value of 0.75, and the cycle T of 0.09 is expressed by the following equation (1):

$$Mx/Gx = 0.09 \times n - 0.06 \ (n: \text{natural number}) \quad (1).$$

When constructing a new mesa-type AT-cut quartz-crystal vibrating piece having the vibration frequency of 38.400 MHz, the Mx/Gx of the AT-cut quartz-crystal vibrating piece 30 in best mode dimensions of the excitation unit 31 and peripheral region 32 can be calculated by using the equation (1), in order to suppress the unnecessary vibration and to obtain low CI value.

<Thickness t of the Excitation Unit 31 and the Length Mx of the Excitation Unit 31>

Experiments were done to determine the best-mode dimensions of the AT-cut quartz-crystal vibrating piece 30. In the experiment, the CI values were measured by maintaining the vibration frequency at a constant vibration frequency and altering the length Mx of the excitation unit 31 the in x-axis direction. The relationships are explained hereafter.

Figure 4:
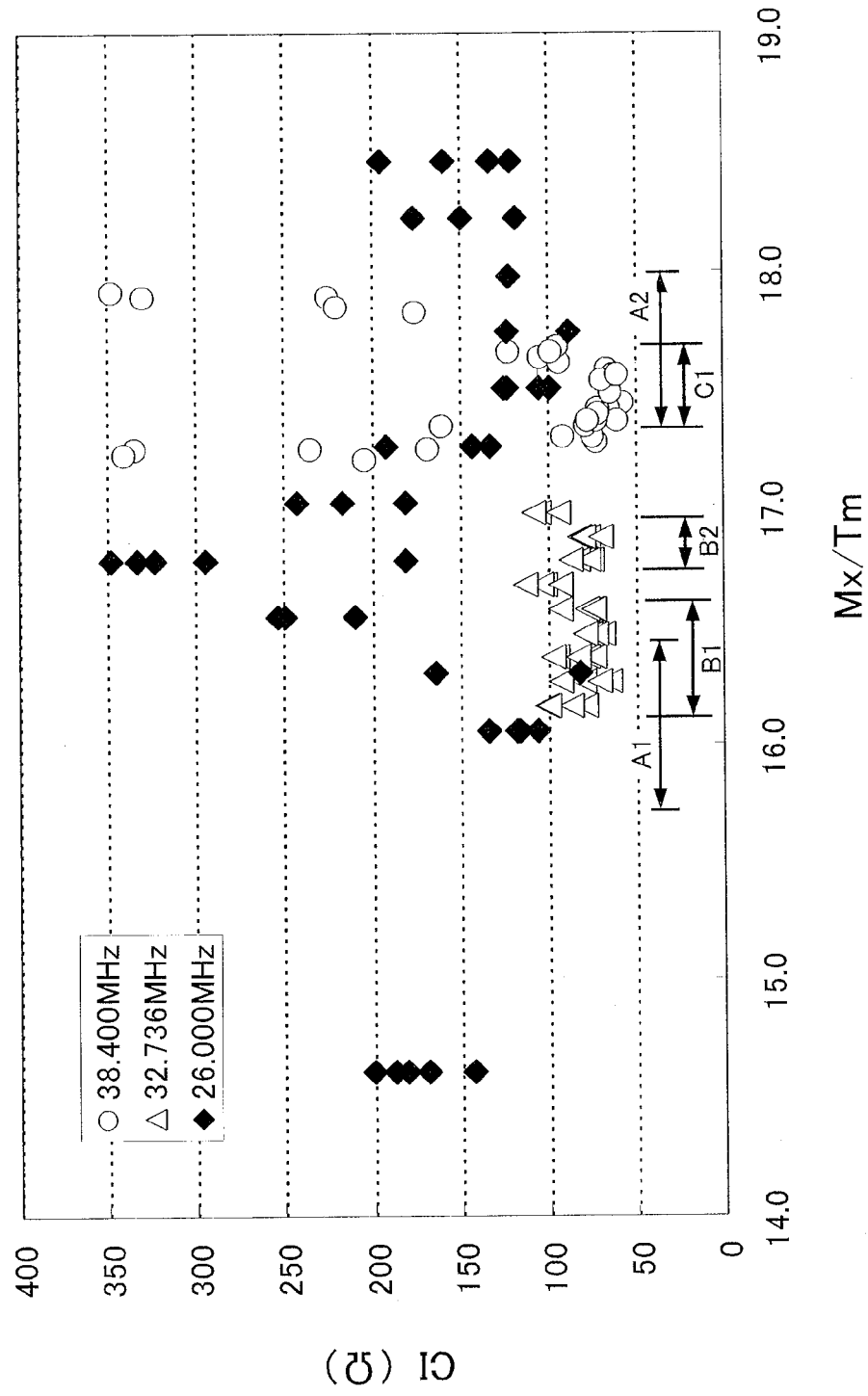
FIG. 4 is a graph showing the relationships between the Mx/Tm ratios and the CI value, wherein the vibration frequencies of the AT-cut quartz-crystal vibrating piece 30 are 26.000 MHz, 32.736 MHz and 38.400 MHz.

FIG. 4 is a graph showing the relationships between the Mx/Tm ratios and the CI value, wherein the vibration frequencies of AT-cut quartz-crystal vibrating piece 30 are 26.000 MHz, 32.736 MHz and 38.400 MHz. The abscissa of FIG. 4 indicates the Mx/Tm ratio and the ordinate indicates the CI value (Ω). In the graph, the black diamonds indicate an AT-cut quartz-crystal vibrating piece 30 having vibration frequency of 26.000 MHz, the white triangles indicate vibration frequency of 32.736 MHz and the white circles indicate vibration frequency of 38.400 MHz. The CI value is a value of each Mx value of the plurality of the AT-cut quartz-crystal vibrating piece 30 manufactured, in which the thickness Tm of the excitation unit 31 is fixed and the length Mx of the excitation unit 31 in x-axis direction is altered.

In the AT-cut quartz-crystal vibrating piece 30 having the vibration frequency of 26.000 MHz, which is indicated in black diamond, the maximum value of the CI value is acquired whenever the Mx/Tm ratio is approximately 16.9, and the minimum value of the CI value is acquired whenever the Mx/Tm ratio is approximately between 16.1 and 17.7. Since the Mx/Tm ratio is preferred to acquire the CI value of closer to the minimum value, the Mx/Tm ratio is preferred to be between 15.7 and 16.4, and between 17.3 and 18.0. In the graph, the region between the values of 15.7 and 16.4 is indicated as the region A1 and region between the values of 17.3 and 18.0 is indicated as the region A2.

In the AT-cut quartz-crystal vibrating piece 30 having the vibration frequency of 32.736 MHz, which is indicated with white triangle on the graph, the minimum value of the CI value is not specifically indicated. Therefore, the region where the CI value minimizes is identified. For example, the range of Mx/Tm where the CI value reaches below 90 Ω is between 16.1 and 16.6, and 16.7 and 16.9, and the preferable CI value is taken between these values. In this graph, the range between the values of 16.1 and 16.6 is indicated as the region B1 and the range between the values of 16.7 and 16.9 is indicated as the region B2.

In the AT-cut quartz-crystal vibrating piece 30 having the vibration frequency of 38.400 MHz, which is indicated with white circle on the graph, the minimum value is presumed to be taken around the Mx/Tm ratio of 17.5. For example, whenever the region of the CI value below 100 Ω is calculated, the region is within the range of Mx/Tm between 17.3 and 17.7, and the preferable CI value is taken between these values. In this graph, this range is indicated as region C1.

Whenever the Mx/Tm ratio of the AT-cut quartz-crystal vibrating piece 30 is within the regions of A1, A2, B1, B2 and C1 of each corresponding vibration frequency, the AT-cut quartz-crystal vibrating piece 30 acquires the preferable CI value. According to FIG. 4, for all above-mentioned vibration frequencies in the AT-cut quartz-crystal vibrating piece 30, the regions for acquiring the best-mode CI values are included in the Mx/Tm range of 15.7 and 18.0. Therefore, in the initial structure of the AT-cut quartz-crystal vibrating piece 30, it is preferred to construct the Mx/Tm ratio within the range of 15.7 to 18.0, instead of relying on the vibration frequency. Also, since this range includes a region where the CI value decreases, it is assumed that this range includes the region where the unnecessary vibration of the AT-cut quartz-crystal vibrating piece 30 is suppressed.

<Thickness Tm of the Excitation Unit 31 and the Thickness Ts of the Peripheral Region 32>

During manufacture of the AT-cut quartz-crystal vibrating piece 30, it is difficult to construct the length Mx of the excitation unit 31 accurately, and if the acceptable margin of error of the length Mx of the excitation unit 31 is small, the percentage of defective product increases in the manufacturing process. Therefore, it is preferred that the length Mx of the excitation unit 31 is constructed so that the acceptable margin of error can be large. The acceptable margin of the product is determined by selecting the range where the CI (crystal impedance) value is lowered, so that the unnecessary vibration generated on the AT-cut quartz-crystal vibrating piece 30 is suppressed. The relationship between the thickness Ts of the peripheral region 32 of the excitation unit 31 and the thickness Tm of the excitation unit 31 is explained using FIGS. 5A to 6C, in order to obtain a large acceptable margin of error of the length Mx of the excitation unit 31. Also, in the explanation below, the length Gx of outline of the AT-cut quartz-crystal vibrating piece 30 in x-axis direction is, for example, 990 μm, the width Gz of the outline of the AT-cut quartz-crystal vibrating piece 30 in z'-axis direction is, for example, 668 μm, and the thickness Tm of the excitation unit 31 is, for example, 41.8 μm.

Figure 5A:
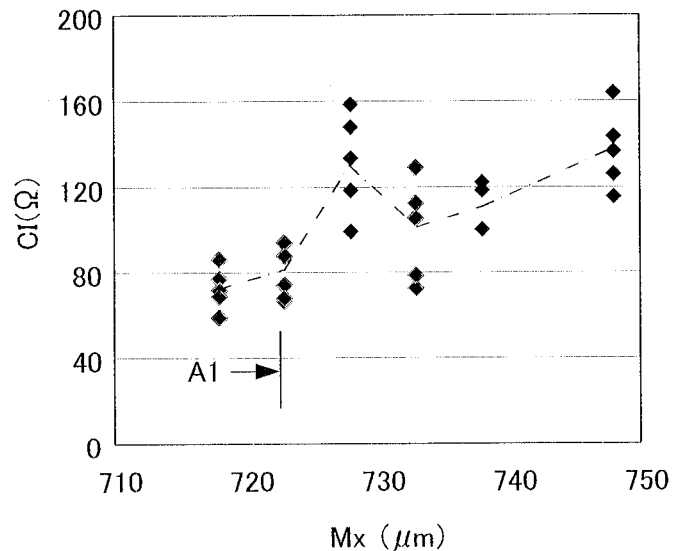
FIG. 5A is a graph indicating the correlation between the CI value, in which (Tm−Ts) is 2 μm, and the length Mx of the excitation unit 31 in x-axis direction.

FIG. 5A is a graph indicating the correlation between the CI value, in which (Tm−Ts) is 2 μm, and the length Mx of the excitation unit 31 in x-axis direction. If the (Tm−Ts) is 2 μm, the height h of the half of the thickness difference corresponds to 1 μm. Also, whenever the thickness Tm of the excitation unit 31 is 41.8 μm, the thickness Ts of the peripheral region 32 is 39.8 μm. Abscissa of the FIG. 5A indicates the length Mx (μm) of the excitation unit 31 in x-axis direction, and ordinate indicates the CI value.

Black diamonds in the FIG. 5A indicates the experimental result at the vibration frequency of 38.4 MHz, and (Tm−Ts) being 2 μm. In the experiment, a plurality of AT-cut quartz-crystal vibrating pieces 30 are manufactured, all having the same excitation unit length Mx, and the CI value is calculated for each AT-cut quartz-crystal vibrating piece 30. The intermediate value between the maximum value and minimum value of the CI value at each length of Mx value is connected in one dotted-dash line on the figure. The region of the length Mx is presumed from the graph, in which the region indicates the intermediate value between the maximum CI value and the minimum CI value is below 80Ω, in order to consider the acceptable margin of error of the length Mx. In FIG. 5A, whenever the length Mx is shorter than approximately 723 μm, the intermediate value is below 80Ω. From this graph, the width A1 of the Mx of the intermediate value of the CI value of below 80Ω cannot be determined. Also, the ratio of the (Tm−Ts)/Tm is 0.048.

Figure 5B:
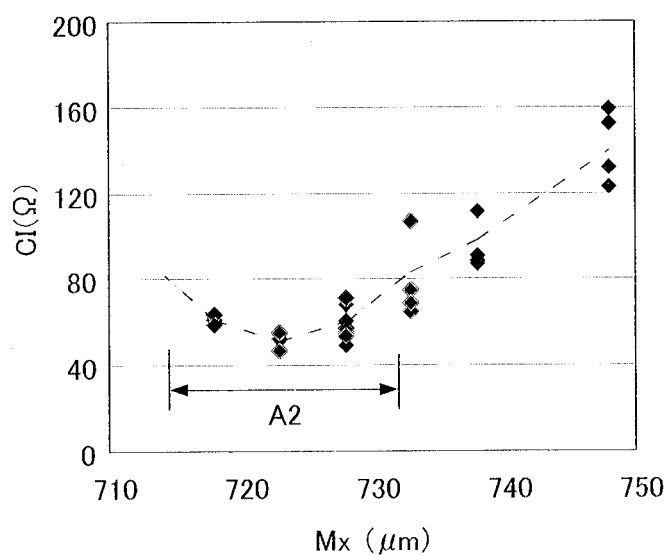
FIG. 5B is a graph indicating the correlation between the CI value, in which (Tm−Ts) is 4 μm, and the length Mx of the excitation unit 31 in x-axis direction.

FIG. 5B is a graph indicating correlation between the CI value, in which (Tm−Ts) is 4 μm, and the length Mx of the excitation unit 31 in the x-axis direction. Black diamonds in the FIG. 5B indicate the experimental result at a vibration frequency of 38.4 MHz, with (Tm−Ts) being 4 μm. If the (Tm−Ts) is 4 μm, the height h of the half of the thickness difference corresponds to 2 μm. Also, the thickness Ts of the peripheral region 32 is 37.8 μm. Other than the height h of the half of the thickness difference, FIG. 5B follows the same explanation as FIG. 5A, and explanations regarding the similar components are omitted. In FIG. 5B, the intermediate value between the maximum value and the minimum value of the CI value of the AT-cut quartz-crystal vibrating piece 30 is below 80Ω, whenever the length Mx is between approximately 714 μm to 731 μm. Therefore, the width A2 of the Mx where the intermediate value of the CI value is below 80 Ω is approximately 17 μm. Also, the ratio of the (Tm−Ts)/Tm is 0.096.

Figure 6A:
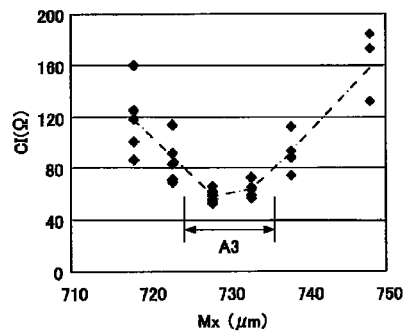
FIG. 6A is a graph indicating the correlation between the CI value, in which (Tm−Ts) is 6 μm, and the length Mx of the excitation unit 31 in x-axis direction.

FIG. 6A is a graph indicating correlation between the CI value, in which (Tm−Ts) is 6 μm, and the length Mx of the excitation unit 31 in the x-axis direction. Black diamonds in the FIG. 6A indicate the experimental result at a vibration frequency of 38.4 MHz and (Tm−Ts) being 6 μm. If the (Tm−Ts) is 6 μm, the height h of the half of the thickness difference corresponds to 3 μm. Also, the thickness Ts of the peripheral region 32 is 35.8 μm. Other than the height h of the half of the thickness difference, FIG. 6A follows the same explanation as FIG. 5A, and explanations regarding the similar components are omitted. In FIG. 6A, the intermediate value between the maximum value and the minimum value of the CI value of the AT-cut quartz-crystal vibrating piece 30 is below 80Ω, whenever the length Mx is between approximately 723 μm to 736 μm. Therefore, the width A3 of the Mx where the intermediate value of the CI value is below 80Ω is approximately 13 μm. Also, the ratio of the (Tm−Ts)/Tm is 0.14.

Figure 6B:
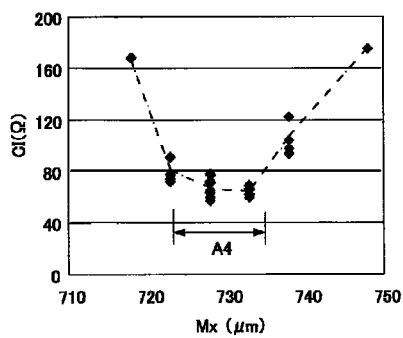
FIG. 6B is a graph indicating the correlation between the CI value, in which (Tm−Ts) is 8 μm, and the length Mx of the excitation unit 31 in x-axis direction.

FIG. 6B is a graph indicating correlation between the CI value, in which (Tm−Ts) is 8 μm, and the length Mx of the excitation unit 31 in the x-axis direction. Black diamonds in FIG. 6B indicate the experimental result at a vibration frequency of 38.4 MHz and (Tm−Ts) being 8 μm. If the (Tm−Ts) is 8 μm, the height h of the half of the thickness difference corresponds to 4 μm. Also, the thickness Ts of the peripheral region 32 is 33.8 μm. Other than the height h of the half of the thickness difference, FIG. 6B follows the same explanation as FIG. 5A, and explanations regarding the similar components are omitted. In FIG. 6B, the intermediate value between the maximum value and the minimum value of the CI value of the AT-cut quartz-crystal vibrating piece 30 is below 80Ω, whenever the approximate length Mx is between 724 μm to 735 μm. Therefore, the width A4 of the Mx where the intermediate value of the CI value reaches below 723 Ω is approximately 11 μm. Also, the ratio of the (Tm−Ts)/Tm is 0.19.

Figure 6C:
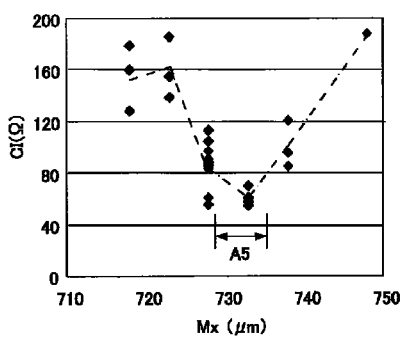
FIG. 6C is a graph indicating the correlation between the CI value, in which (Tm−Ts) is 10 μm, and the length Mx of the excitation unit 31 in x-axis direction.

FIG. 6C is a graph indicating correlation between the CI value, in which (Tm−Ts) is 10 μm, and the length Mx of the excitation unit 31 in the x-axis direction. Black diamonds in FIG. 3B (e) indicate the experimental result at a vibration frequency of 38.4 MHz and (Tm−Ts) being 10 μm. If the (Tm−Ts) is 10 μm, the height h of the half of the thickness difference corresponds to 5 μm. Also, the thickness Ts of the peripheral region 32 is 31.8 μm. Other than the height h, FIG. 6C follows the same explanation as FIG. 5A, and explanations regarding the similar components are omitted. In FIG. 6C, the intermediate value between the maximum value and the minimum value of the CI value of the AT-cut quartz-crystal vibrating piece 30 is below 80 Ω, whenever the approximate length Mx is between 729 μm to 735 μm. Therefore, the width A5 of the Mx where the intermediate value of the CI value is below 80 Ω is approximately 6 μm. Also, the ratio of the (Tm−Ts)/Tm is 0.24.

In order to reduce the percentage of defective products, it is preferred that the acceptable margin of the length Mx in the manufacturing is larger than 10 μm, and in order to prevent causing any adverse effect on the characteristic of the quartz-crystal oscillator having the AT-cut quartz-crystal vibrating piece 30, it is preferred that the CI value is below 80Ω. Among widths A1 to A5 of FIGS. 5A to 6C, the width is larger than 10 μm whenever the (Tm−Ts) is between 4 μm to 8 μm. Here, the ratio of the (Tm−Ts)/Tm is between 0.096 and 0.19. Also, although the width A1 in FIG. 5A cannot be determined, in widths A2 to A5, as the value of the (Tm−Ts) decreases, the value of the length Mx increases, and width A1 is assumed to be larger than 10 μm. Therefore, it is assumed that (Tm−Ts)/Tm should be larger than 0.048.

Also, considering the margin of error, the maximum value of the (Tm−Ts)/Tm should be within 0.2 or smaller. Therefore, it is preferred that the ratio (Tm−Ts)/Tm is larger than 0.048 and smaller than 0.2. Therefore, in the AT-cut quartz-crystal vibrating piece 30 having the vibration frequency of 38.4 MHz, a large acceptable margin of the manufacturing error can be taken and reduce the percentage of defective product, whenever the (Tm−Ts)/Tm is larger than 0.048 and smaller than 0.2. Also, whenever the (Tm−Ts)/Tm of the AT-cut quartz-crystal vibrating piece 30 is within a range, the CI value decreases, the unnecessary vibration from the vibrating unit is suppressed, and degradation of its characteristics are prevented.

Second Embodiment

The AT-cut quartz-crystal vibrating piece 30 can be surrounded by an outer frame. A quartz-crystal device 200 comprising the AT-cut quartz-crystal vibrating piece surrounded by the outer frame is explained hereafter.

<Configuration of the Quartz-Crystal Device 200>

Figure 7A:
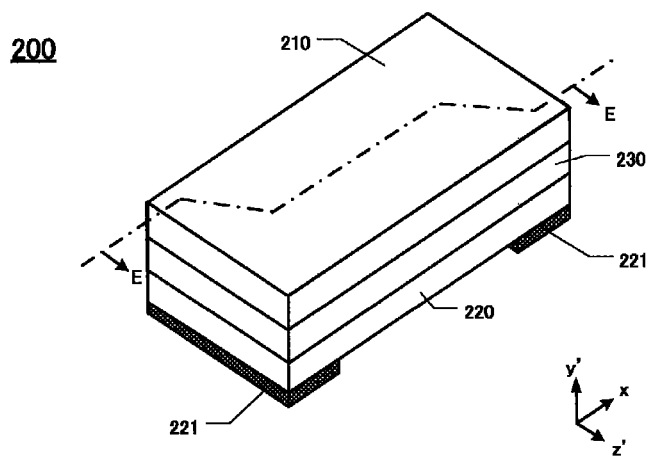
FIG. 7A is a perspective view of the quartz-crystal device 200.

FIG. 7A is an exploded view of the quartz-crystal device 200. The quartz-crystal device 200 comprises a lid 210, an AT-cut quartz-crystal vibrating piece 230 and a base 220. On the quartz-crystal device 200, the lid 210 is disposed on the upper portion, the base 220 is disposed on the lower portion, and the AT-cut quartz-crystal vibrating piece 230 is sandwiched between the lid 210 and base 220. The external electrodes 221 are disposed on a lower surface of the base 220. The lid 210 and base 220 are fabricated from a glass or quartz-crystal material.

Figure 7B:
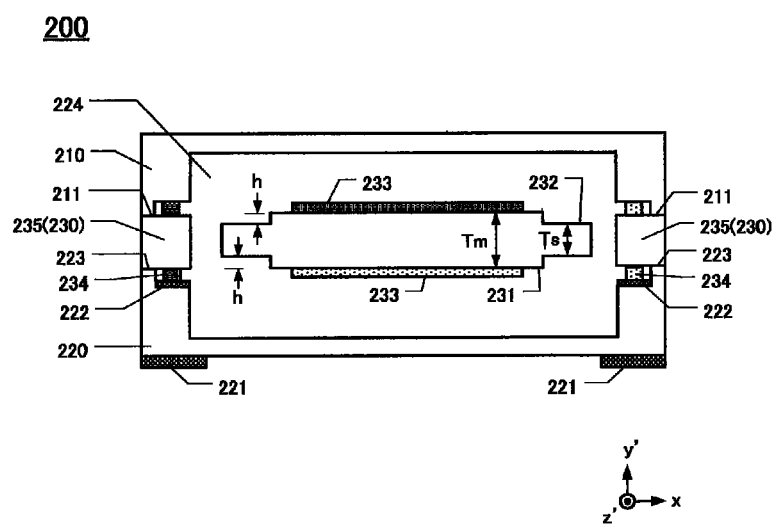
FIG. 7B is a cross-sectional view of the FIG. 4A taken along E-E line.

FIG. 7B is a cross-section of FIG. 7A along E-E line. On the AT-cut quartz-crystal vibrating piece 230, an excitation unit 231 and a peripheral region 232 are formed, in which the peripheral region 231 is formed on the periphery of the excitation unit 231, and the outer frame 235 is formed so as to surround the peripheral region 232. The outer frame 235 is situated to support the peripheral region 232. The excitation electrodes 233 are formed on both the first principal surface and the second principal surface of the excitation unit 231, and the extraction electrodes 234 are formed on the outer frame 235 by going through from the excitation electrode 233 and passing through the peripheral excitation unit 232. The AT-cut vibrating piece 230 vibrates at a predetermined vibration per minute whenever a voltage is applied to the pair of excitation electrodes 233. The lid 210 is bonded by contacting the first principal surface of the outer frame 235 and the first surface 211 formed on the −y'-axis side surface of the lid 210, and the base 220 is bonded by contacting the second principal surface of the base 220 and the second surface 223 formed on the +y'-axis side surface. The connecting electrodes 222 are formed on the +y'-axis side surface of the base 220, and when bonding the connecting electrodes 222 to the AT-cut quartz-crystal vibrating piece 230, the connecting electrodes 222 are bonded to the extraction electrodes 234. Also, the connecting electrodes 222 are electrically connected to the external electrodes 221 via conductor (not shown).

On the AT-cut quartz-crystal vibrating piece 230, the thickness of the excitation unit 231 is denoted as Tm, and thickness of the peripheral excitation unit 232 is denoted as Ts. The thickness difference of the excitation unit 231 and the peripheral excitation unit 232 are formed on the +y'-axis side surface and the −y'-axis side surface, and the height h is positive. Further, the AT-cut quartz-crystal vibrating piece 230 is fabricated by synthetic quartz-crystal, which is as same as the AT-cut quartz-crystal vibrating piece 30, the x-axis direction of the AT-cut quartz-crystal vibrating piece 230 is same respective axial direction as the crystallographic X-axis of the quartz-crystal, and the z'-axis direction of the AT-cut quartz-crystal vibrating piece 30 is same respective axial direction as direction of the quartz-crystal from the Z-axis to the Y-axis direction tilted by 35° 15'. The AT-cut quartz-crystal vibrating piece 230 is cut in the same crystallographic direction, which is similar to the AT-cut quartz-crystal vibrating piece 30.

Figure 8A:
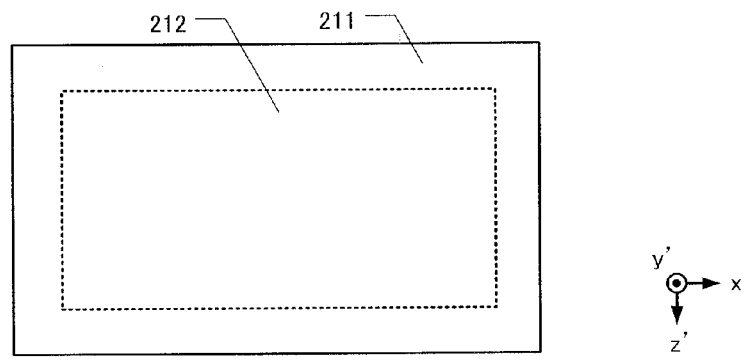
FIG. 8A is a plan view of the lid 210.

FIG. 8A is a plan view of the lid 210. The lid 210 has a rectangular principal surface having a longitudinal axis in the x-axis direction and a short axis in the z'-axis direction. On the peripheral unit of the −y'-axis side surface, a first surface 211 is formed, which is connected to the outer frame 235 of the AT-cut quartz-crystal vibrating piece 230, and a recess 212 is formed in center portion of the lid 210, so as to be surrounded by the first surface 211.

Figure 8B:
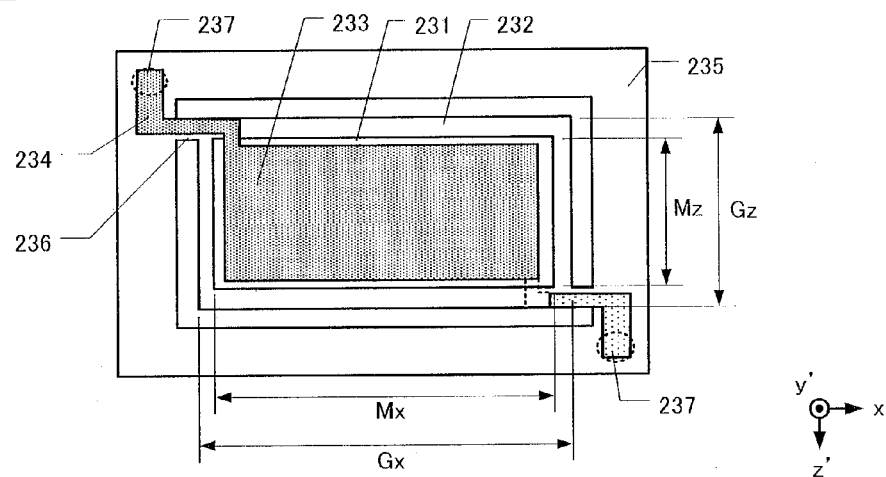
FIG. 8B is a plan view of the AT-cut quartz-crystal vibrating piece 230.

FIG. 8B is a plan view of the AT-cut quartz-crystal vibrating piece 230. The AT-cut quartz-crystal vibrating piece 230 and the outer frame 235 are connected by the connecting arms 236. The extraction electrodes 234, extracted from the excitation electrode 233 formed on the excitation unit 231, are formed by passing through the peripheral excitation unit 232 and connecting arms 236 and formed to the corner of the outer frame 235. On the connection points 237 formed on respective corners of the outer frame 235, each extraction electrode 234 connects to the respective connecting electrodes 222 on the base 220. The connection points 237 are formed on corners of the outer frame 235 in −y'-axis side surface, which is indicated with dotted oval circle in FIG. 8B. Length Gx of the excitation unit 231 and peripheral region 232 on the AT-cut quartz-crystal vibrating piece 230 in the x-axis direction is, for example, 1.35 mm, and width Gz of the excitation unit 231 and peripheral region 232 on the AT-cut quartz-crystal vibrating piece 230 in the z'-axis direction is, for example, 0.85 mm. Length Gx of the excitation unit 231 and peripheral region 232 on the AT-cut quartz-crystal vibrating piece 230 in x-axis direction is, for example, 990 μm, and width Gz of the excitation unit 231 and peripheral region 232 on the AT-cut quartz-crystal vibrating piece 230 in z'-axis direction is, for example, 700 μm. Also, length of the excitation unit 31 in x-axis direction is denoted as Mx and in z'-axis direction is denoted as Mz.

Figure 8C:
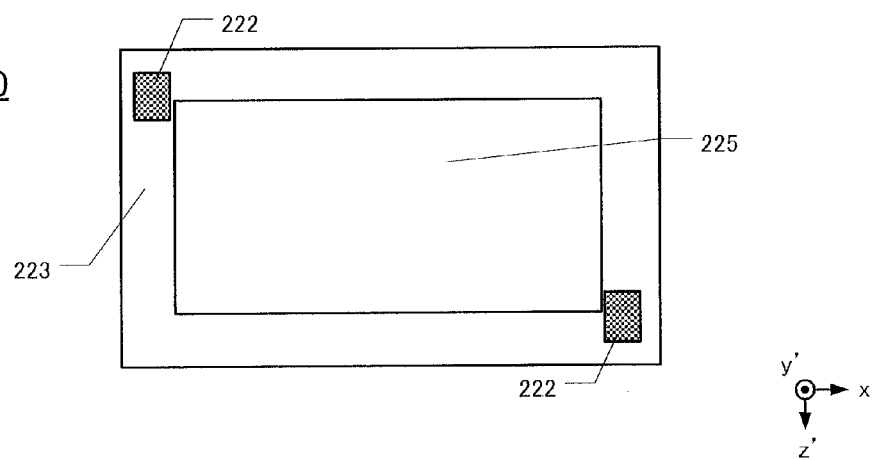
FIG. 8C is a plan view of the base 220.

FIG. 8C is a plan view of the base 220. The second surface 223 is formed on the outer periphery of the base 220 in +y'-axis side surface, which is a surface bonded to the outer frame 235 of the AT-cut quartz-crystal vibrating piece 230, and a recess 225 is formed on the inner side of the second surface 223. On part of the second surface 223 in +y'-axis side surface of the base 220, the connecting electrodes 222 are formed, which are electrically connected to the connection point 237 on the extraction electrodes 234 of the AT-cut quartz-crystal vibrating piece 230.

Even if the outer frame is situated on the AT-cut quartz-crystal vibrating piece, vibrating energy of unnecessary vibration, generated on the peripheral region of the excitation unit, do not change largely, since the peripheral region and the outer frame are only connected by the connecting arms. Therefore, the relationship defined in the equation (1) can be applied to the AT-cut quartz-crystal vibrating piece 230. Also, setting the Mx/Tm ratio of the AT-cut quartz-crystal vibrating piece within the range of 15.7 and 18.0, and further the method of forming the AT-cut quartz-crystal vibrating piece having the Mx/Tm ratio of between 15.7 and 16.4 or between 17.3 and 18.0 for vibration frequency of 26.000 MHz, between 16.1 and 16.6 and 16.7 and 16.9 for vibration frequency of 32.736 MHz, and between 17.3 and 17.7 for vibration frequency of 38.400, can be applied to the AT-cut quartz-crystal vibrating piece 230. Further, the ratio (Tm−Ts)/Tm of larger than 0.048 and smaller than 0.2 can be applied to the AT-cut quartz-crystal vibrating piece 230.

As mentioned above, although optimal embodiments of the present disclosure were explained in detail, it will be understood by a person skilled in the art that the disclosure encompasses various alterations and modifications to the embodiments, within the technical scope of the invention.

What is claimed is:

1. A quartz-crystal device comprising:
a mesa-type AT-cut quartz-crystal vibrating piece for vibrating at 38.400 MHz, comprising:
a rectangular excitation unit and a peripheral region formed on the periphery of the excitation unit and having a thickness less than a thickness of the excitation unit, is represented by the following equation:

$$Mx/Gx = 0.09 \times n - 0.06 \text{ (}n\text{: natural number)} \quad (1)$$

wherein a crystallographic x-axis dimension of the excitation unit is defined as Mx (mm) and the crystallographic x-axis dimension of the excitation unit and peripheral region is defined as Gx (mm).

2. The quartz-crystal device of claim 1 comprising;
an outer frame for surrounding the peripheral excitation unit and supporting the peripheral excitation unit thereof;
a lid having a first surface to be bonded onto the first principal surface of the outer frame; and
a base having a second surface to be bonded onto the second principal surface of the outer frame.

3. A quartz-crystal device comprising:
a mesa-type AT-cut quartz-crystal vibrating piece comprising:
a rectangular excitation unit and a peripheral region formed on the periphery of the excitation unit and having a thickness less than a thickness of the excitation unit;
wherein the thickness of the excitation unit is denoted as Tm, and a length of the excitation unit along the crystallographic x-axis of the excitation unit is denoted as Mx, a minimum value of the crystal impedance is acquired within the range of Mx/Tm being 15.7 or larger and 18.0 or smaller; and
wherein a size of the excitation unit at the minimum value is implemented in the Mx/Tm ratio.

4. A quartz-crystal device comprising:
a mesa-type AT-cut quartz-crystal vibrating piece for vibrating at 38.400 MHz, comprising:
a rectangular excitation unit and a peripheral region formed on the periphery of the excitation unit and having a thickness less than a thickness of the excitation unit, is represented by the following ratio:

$$(Tm - Ts)/Tm;$$

wherein the thickness of the excitation unit is defined as Tm (μm) and the thickness of the peripheral region is defined as Ts (μm); and
wherein the ratio (Tm−Ts)/Tm comprises a value 0.048 or larger and 0.2 or smaller.

5. The quartz-crystal device of claim 4 comprising:
an outer frame for surrounding the peripheral excitation unit and supporting the peripheral excitation unit thereof;
a lid having a first surface to be bonded onto the first principal surface of the outer frame; and
a base having a second surface to be bonded onto the second principal surface of the outer frame.

6. The quartz-crystal device of claim 4, comprising:
a base having a recess for containing the mesa-type AT-cut quartz-crystal vibrating piece; and
a lid for hermetically sealing the recess.

7. The quartz-crystal device of claim 3, comprising:
a base having a recess for containing the mesa-type AT-cut quartz-crystal vibrating piece; and
a lid for hermetically sealing the recess.

8. The quartz-crystal device of claim 3, wherein the vibration frequency is 38.400 MHz and the Mx/Tm ratio is 17.3 or larger and 17.7 or smaller.

9. The quartz-crystal device of claim 3, wherein the vibration frequency is 32.736 MHz and the Mx/Tm ratio 16.1 or larger and 16.6 or smaller, or is 16.7 or larger and 16.9 or smaller.

10. The quartz-crystal device of claim 3, wherein the vibration frequency is 26.000 MHz and the Mx/Tm ratio is 15.7 or larger and 16.4 or smaller, or is 17.3 or larger and 18.0 or smaller.

11. The quartz-crystal device of claim 3 comprising:
an outer frame for surrounding the peripheral excitation unit and supporting the peripheral excitation unit thereof;
a lid having a first surface to be bonded onto the first principal surface of the outer frame; and
a base having a second surface to be bonded onto the second principal surface of the outer frame.

12. The quartz-crystal device of claim 8 comprising:
an outer frame for surrounding the peripheral excitation unit and supporting the peripheral excitation unit thereof;
a lid having a first surface to be bonded onto the first principal surface of the outer frame; and
a base having a second surface to be bonded onto the second principal surface of the outer frame.

13. The quartz-crystal device of claim 9 comprising:
an outer frame for surrounding the peripheral excitation unit and supporting the peripheral excitation unit thereof;
a lid having a first surface to be bonded onto the first principal surface of the outer frame; and
a base having a second surface to be bonded onto the second principal surface of the outer frame.

14. The quartz-crystal device of claim 10 comprising:
an outer frame for surrounding the peripheral excitation unit and supporting the peripheral excitation unit thereof;
a lid having a first surface to be bonded onto the first principal surface of the outer frame; and
a base having a second surface to be bonded onto the second principal surface of the outer frame.

15. The quartz-crystal device of claim 1, comprising:
a base having a recess for containing the mesa-type AT-cut quartz-crystal vibrating piece; and
a lid for hermetically sealing the recess.

16. The quartz-crystal device of claim 8, comprising:
a mesa-type AT-cut quartz-crystal vibrating piece of claim 8;
a base having a recess for containing the mesa-type AT-cut quartz-crystal vibrating piece; and
a lid for hermetically sealing the recess.

17. The quartz-crystal device of claim 9, comprising:
a base having a recess for containing the mesa-type AT-cut quartz-crystal vibrating piece; and
a lid for hermetically sealing the recess.

18. The quartz-crystal device of claim 10, comprising:
a base having a recess for containing the mesa-type AT-cut quartz-crystal vibrating piece; and
a lid for hermetically sealing the recess.

\* \* \* \* \*